United States Patent [19]
Sever

[11] Patent Number: 5,982,196
[45] Date of Patent: Nov. 9, 1999

[54] PROGRAMMABLE LOGIC DEVICE PRODUCING A COMPLEMENTARY BIT LINE SIGNAL

[75] Inventor: Ilan Sever, Hadera, Israel

[73] Assignee: Waferscale Integration, Inc., Fremont, Calif.

[21] Appl. No.: 08/847,739

[22] Filed: Apr. 22, 1997

[51] Int. Cl.$^6$ .................. H03K 19/094; H03K 19/173
[52] U.S. Cl. .................. 326/49; 326/44; 326/39; 326/38
[58] Field of Search .................. 326/49, 50, 44, 326/45, 38, 39, 17

[56] References Cited

U.S. PATENT DOCUMENTS

| | | | |
|---|---|---|---|
| 3,566,153 | 2/1971 | Spencer, Jr. .................. | 326/46 |
| 4,336,601 | 6/1982 | Tanaka .................. | 326/43 |
| 4,490,812 | 12/1984 | Guterman .................. | 326/44 |
| 4,617,479 | 10/1986 | Hartmann et al. .................. | 326/45 |
| 4,761,571 | 8/1988 | Golke et al. .................. | 326/31 |
| 4,774,421 | 9/1988 | Hartmann et al. .................. | 326/44 |
| 4,899,070 | 2/1990 | Ou et al. .................. | 326/49 |
| 5,032,744 | 7/1991 | Liu . | |
| 5,434,821 | 7/1995 | Watanabe et al. . | |

OTHER PUBLICATIONS

Book: Phillip E. Allen and Douglas R. Holberg; "CMOS Analog Circuit Design"; Saunders College Publishing, Harcourt Brace Jovanovich 1987, Chapter 6.2–1.

*Primary Examiner*—Michael Tokar
*Assistant Examiner*—Daniel D. Chang
*Attorney, Agent, or Firm*—McDermott, Will & Emery

[57] ABSTRACT

A programmable logic device includes a plurality of logic elements. Each logic element includes a raw of transistors formed between a bit line and a source line, elements for generating a complement signal to the bit line signal (the elements have an output complement line) and a differential sense amplifier. Each transistor of the row is connected to a different one of the input lines and has a predefined logic state. The complement line is based on the source line whose signal acts opposite to that of the bit line. The differential sense amplifier is connected to the bit line and to the complement line and indicates when the bit line signal crosses the complement line signal. In one embodiment, the source line signal is raised, in another, the bit line signal is lowered, both with offset circuitry. In a further embodiment, a separate row of transistors (implementing the same logic equation) with a different operating voltage level is provided and the source line of the separate row of transistors acts as the complement line. In all embodiments, the operating voltage levels of one or both of the bit line and complement line are adjusted so that any transition of the source line related signal will cross a corresponding transition on the bit line related signal.

7 Claims, 8 Drawing Sheets

PROGRAMMABLE LOGIC DEVICE PRODUCING A COMPLEMENTARY BIT LINE SIGNAL

FIELD OF THE INVENTION

The present invention relates to programmable logic devices generally and to such devices having differential sensing in particular.

BACKGROUND OF THE INVENTION

Programmable logic devices implement Boolean logic and comprise an array of non-volatile cells, each of which is programmed on or off. A programmed cell has a high threshold and therefore, does not conduct while a non-programmed cell has a low threshold and therefore, does conduct. Exemplary non-volatile cells include EPROM, PROM and FLASH type memory array cells.

Reference is made to FIG. 1 which illustrates a row of one array having six cells 10, 12, 14, 16, 18 and 20. The cells 10–20 are connected in parallel between a bit line 22 and a source line 24. A pull-up transistor 26 is connected to the bit line 22 and to a voltage source Vcc. A pulldown transistor 28 is connected to the source line 24 and to ground. The gate of each cell is controlled by an input signal where, typically, two neighboring cells are connected to an input signal, for example A, and its logical complement $\overline{A}$. FIG. 1 shows three types of input signals, A, B and C and their complements $\overline{A}$, $\overline{B}$ and $\overline{C}$. Finally, the output signal is measured by a measuring unit 30.

The cells 10–20 are programmed to implement the desired Boolean operation on the signals A, B and C. FIG. 1 shows that cells 10, 16 and 18, connected respectively to signals A, $\overline{B}$ and C, are programmed (e.g. high threshold) and cells 12, 14 and 20, connected respectively to signals $\overline{A}$, B and $\overline{C}$, are not programmed (e.g. low threshold).

When values are provided on the input signals, the signal on the bit line 22 will represent the Boolean combination of the input signals, Since a true value is denoted with a 0, the signal on the bit line 22 is actually the complement of the Boolean combination. Thus, the signal on bit line 22 of FIG. 1 represents:

$$BL = \overline{A + B + \overline{C}} = \overline{A} \cdot \overline{B} \cdot C \qquad 1$$

The measuring unit 30 determines whether the signal on bit line 22 corresponds to either a 1 value (false) or a 0 value (true). The actual voltage of the bit line varies in accordance with the number of transistors which are not programmed. This affects the transition between states, as illustrated in FIG. 2 to which reference is now made. FIG. 2 also illustrates a "trip voltage" 32, the voltage at which the measuring unit 30 determines that it is reading a different state. Thus, above trip voltage 32, measuring unit 30 will output a "1" whereas below trip voltage 32, measuring unit 30 will output a "0".

When all of the transistors are programmed, they do not conduct. The voltage of the bit-line 22 is at its highest since only the pull-up 26 is active. This is called the "1" state.

When all of the transistors are not programmed, and thus, all of them conduct, the voltage of the bit line 22 is at its lowest, known as the "strong 0" state. This state is easy for the measuring unit 30 to define, since the strong 0 voltage is well below the trip voltage 32. However, when the bit line 22 changes to a "1" state, the pull-up 26 has to pull the voltage of the bit line 22 a long way. If pull-up 26 is small, which is common, it will take some time, as shown, before the voltage of the bit line 22 crosses the trip voltage 32.

When only one transistor conducts, there Is an equal pull between the pullup 26 and the conducting transistor, which acts as a pull-own, the result being that the bit line voltage goes to a value lower than the trip point, but only slowly. This Is known as a "weak 0" state (graph (b)). The measuring unit 30 has to wait for the bit line voltage to stabilize. However, the transition from a weak 0 state to a 1 state, the transition shown in graph (b), is easier since the weak 0 state is closer to the trip voltage 32.

A similar situation occurs when more than one transistor conducts, Typically, the trip voltage 32 is placed just above the highest voltage value which can be defined as a 0 state.

Graph (c) illustrates the transition from a 1 state to a strong 0 state is and indicates that the transition is quick and well-defined. Graph (d) illustrates the transition from a 1 to a weak 0 state and indicates that the transition is slow.

SUMMARY OF THE PRESENT INVENTION

In the prior art, the measuring unit observes the voltage (or current) an the bit-line only. This is "Single-ended" sensing which is sensitive to noise and therefore, in order to accurately determine the logic state in the presence of noise, a relatively wide noise margin is needed, which increases the difference between the levels of "1" and "0". This causes very slow sensing because the sensing device has to wait for the bit-line to move between two levels which are far from each other.

However, differential sensing, (which is used in the current application) is less sensitive to noise and therefore, a very small difference in the voltage on the bit-line is sufficient to accurately determine the logic state, even in the presence of noise. In addition, the differential sense-amplifier has a very high-gain which causes it to respond very fast to small signal changes.

To utilize such a differential sense amplifier requires having a signal which provides the opposite function to that of the bit line. In other words, the differential sense amplifier requires, as input, the bit line (BL) and $\overline{BL}$, For the bit line, the pull-up 26 acts as a pull-up and the individual cells act as pulldown. Applicant has realized that, for the source line, the individual cells act as pull-ups and the pull-down 28 acts as a pull-own. Thus, Applicant has determined that the source line implements the complement signal to that of the bit line, e.g. $\overline{BL}$, except that the signal on the source line does not cross that of the bit line. Therefore, the signal on the source line has to be raised or that of the bit line lowered. In one embodiment the source line signal is raised, in another, the bit line signal is lowered, both with offset circuitry. In a further embodiment, a separate row of transistors (implementing the same logic equation) with a different operating voltage level is provided and the source line of the separate row of transistors acts as the complement line. This embodiment requires two cells per bit, In all embodiments, the operating voltage levels of one or both of the bit line and complement line are adjusted so that any transition of the source line related signal will cross a corresponding transition on the bit line related signal.

There is therefore provided, in accordance with a preferred embodiment of the present invention, a programmable logic device including a plurality of logic elements, wherein each logic element includes a row of transistors formed between a bit line and a source line, a unit for generating a complement signal to the bit line signal (the unit has an output complement line) and a differential sense amplifier. Each transistor of the row is connected to a different one of the input lines and has a predefined logic state. The differential sense amplifier is connected to the bit line and to the complement line and indicates when the bit line signal has a transition.

Additionally, in accordance with a preferred embodiment of the present invention, the unit for generating includes a second row of transistors and a biasing unit. The second row of transistors forms the complement line and is formed between a second bit line and a second source line. The second row of transistors has the same predefined logic states and is connected in the same way to the input lines as the first row of transistors. The biasing unit biases the voltage levels of the first and second rows of transistors so that any transition of the signal on the second source line will cross a corresponding transition of the signal on the first bit line.

In accordance with a second preferred embodiment of the present invention, the unit for generating includes an offset unit which offsets the signal on the source line so that any transition of the signal produced by the offset unit will cross a corresponding transition of the bit line. The output line of the offset means is the complement line. Alternatively, the unit for generating includes an offset unit which offsets the signal on the bit line so that any transition of the signal produced by the offset means will cross a corresponding transition of the source line. In this latter embodiment, the source line is the complement line.

Furthermore, in accordance with a further preferred embodiment of the present invention, the programmable logic device of any of the previous embodiments has at least two output lines, one connected to the bit line and one connected to the output complement line separate or in addition to the output of the differential sense amplifier.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

The present invention utilizes the source line for the complementary $\overline{BL}$ signal. As mentioned hereinabove, the pull-up 26 acts as a pull-up to the bit line and the individual cells act as pull-downs to it. Applicant has realized that, for the source line, the individual cells act as pull-ups and the pull-down 28 acts as a pull-down and therefore, the source line provides the $\overline{BL}$ signal.

Figure 1:
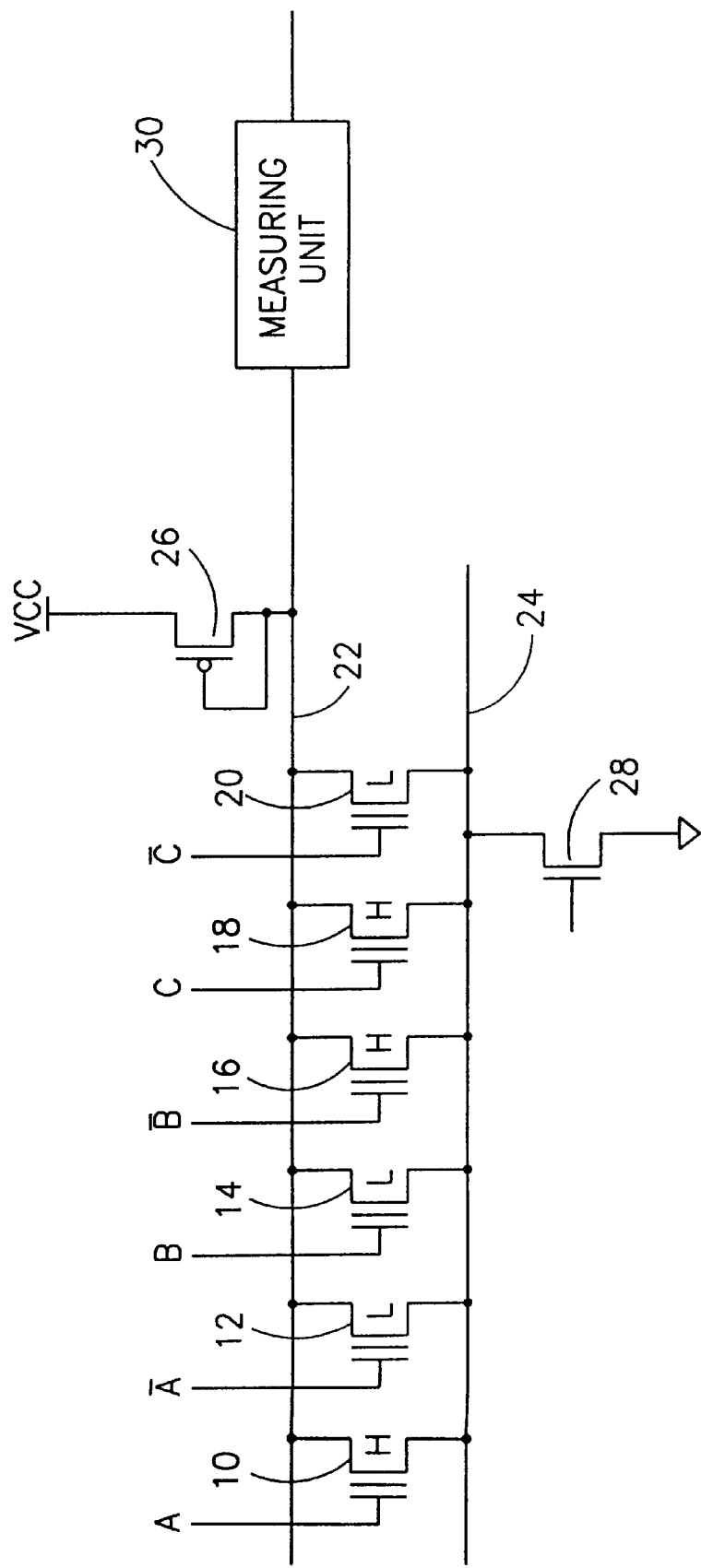
FIG. 1 is a circuit illustration of a row of a prior art programmable logic device.
Figure 2A:
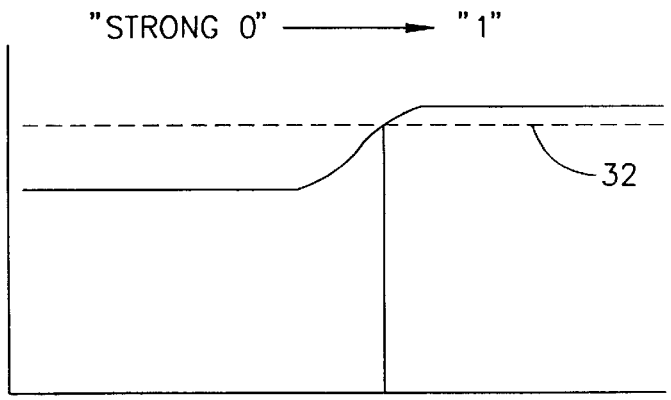
FIG. 2 is a series of graphical illustrations of the transitions between a "1" state and strong and weak "0" states as measured by the bit line.
Figure 2B:
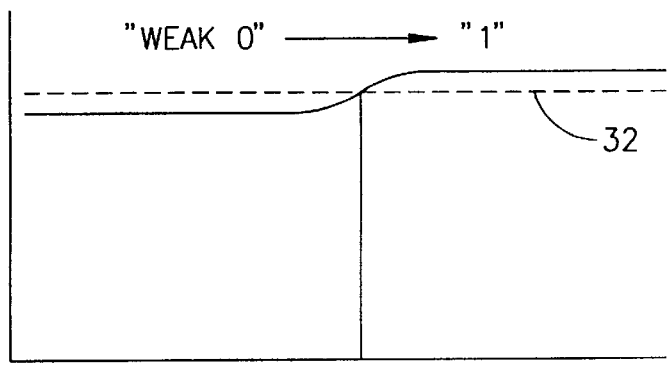
Figure 2C:
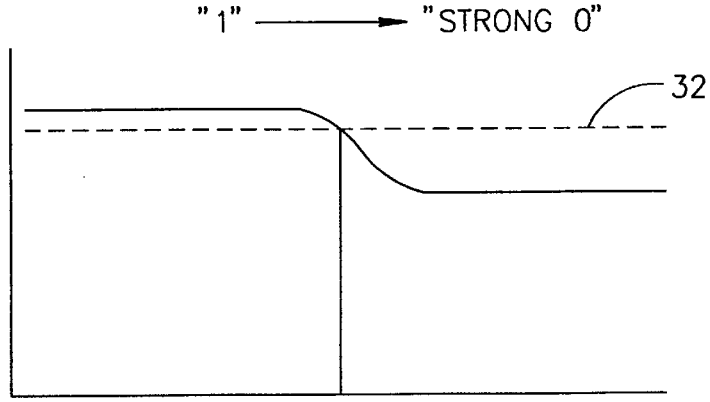
Figure 2D:
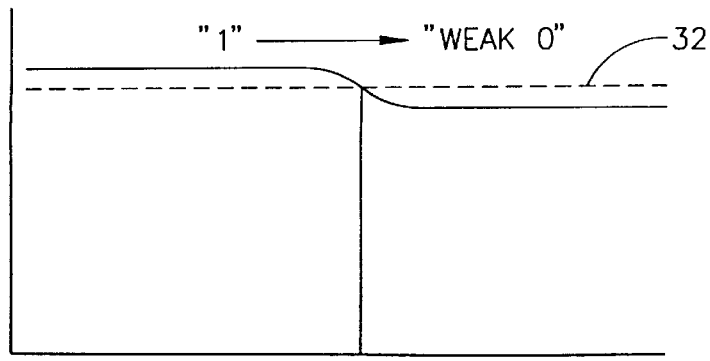
Figure 3A:
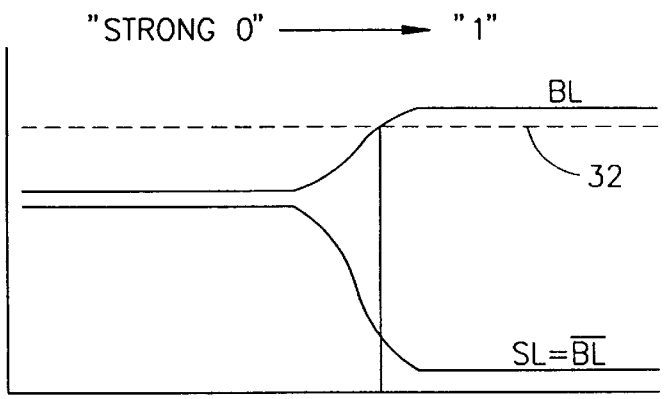
FIG. 3 is a series of graphical illustrations of the transitions between a "1" state and strong and weak "0" states as measured by the bit line and by the source line.
Figure 3B:
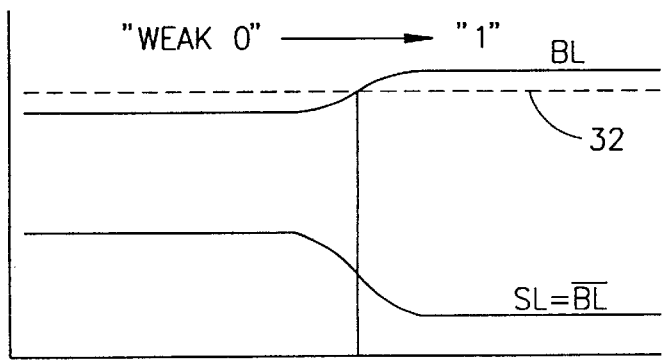
Figure 3C:
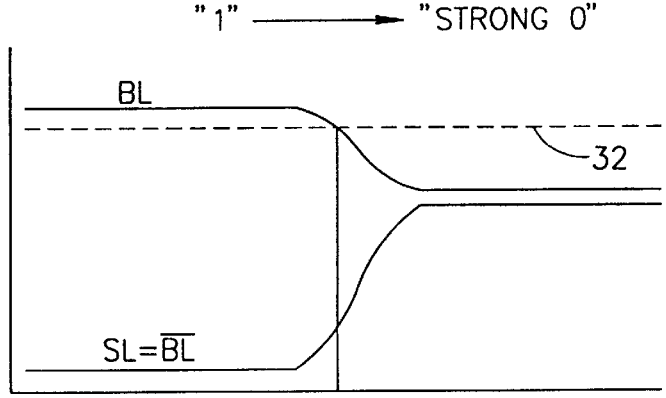
Figure 3D:
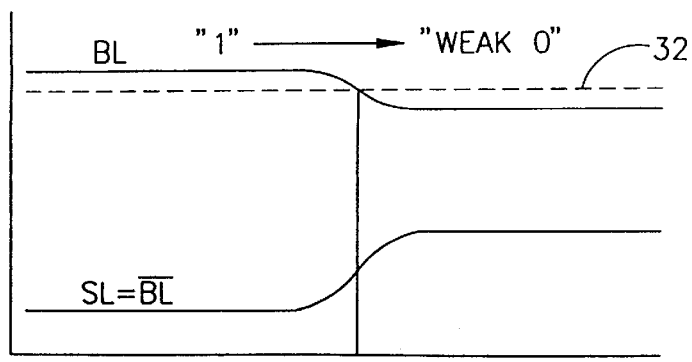
Figure 4A:
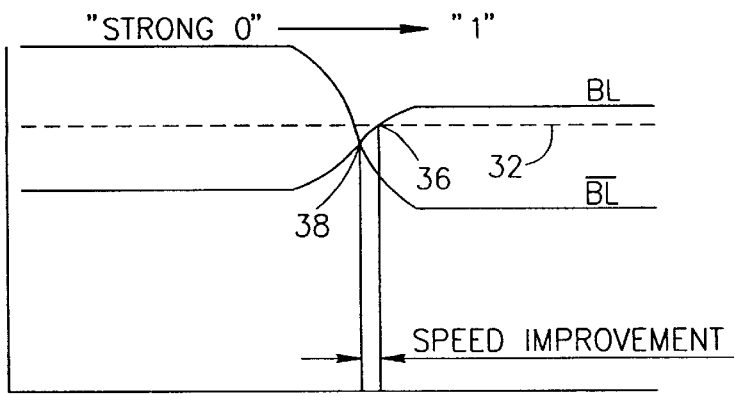
FIG. 4 is a series of graphical illustrations of the transitions between a "1" state and strong and weak "0" states as measured by the bit line and by a raised source line.
Figure 4B:
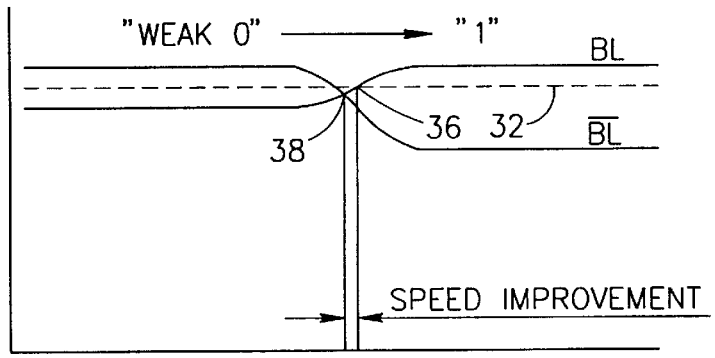
Figure 4C:
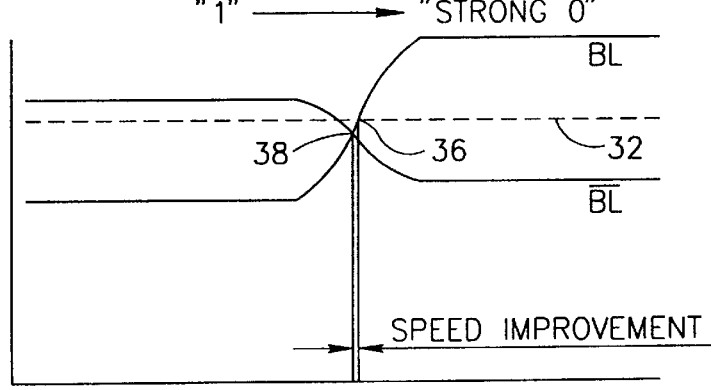
Figure 4D:
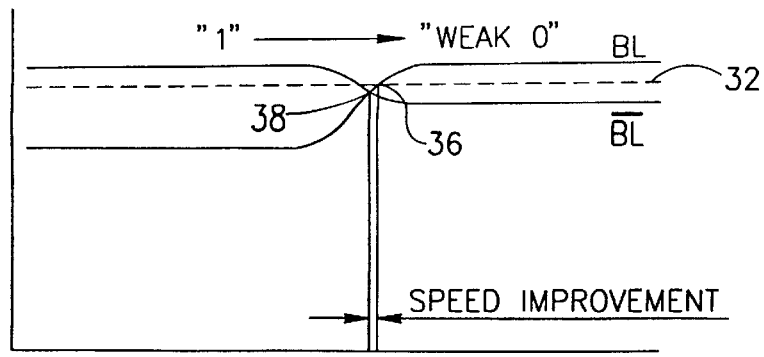

In the example of FIG. 1, the cells with inputs $\overline{A}$, B and $\overline{C}$ are on and pull the bit line down to the value of 0. Thus, the logic expression for the bit line 22 is as provided in equation 1, e.g.:

$$BL=\overline{\overline{A}+B+\overline{C}}=A\cdot\overline{B}\cdot C \qquad 2$$

The same cells pull up the source line 24 to the value of 1 and, therefore, the logic expression for the source line 24 is:

$$SL=\overline{A}+B+\overline{C}=\overline{BL} \qquad 3$$

FIG. 3, to which reference is now briefly made, is similar to FIG. 2 but illustrates the source line signals in addition to the bit line signals. In each graph, the source line changes in the opposite direction to that of the bit line. Typically, the source line transitions are sharper when the bit line transitions are slow and vice versa. However, the source line never reaches the trip voltage 32 because there always is a slight voltage drop across the cells connected between the source line and the bit line.

Graph (a) illustrates the transition from strong 0 to 1. The source line has a high voltage when the bit line is at the strong 0 and a much lower voltage when the bit line is at the 1 level. The transition from one to the next, on the source line, is faster than for the bit line. Graph (b) illustrates the transition from weak 0 to 1. The source line has a medium high voltage when the bit line is at the weak 0 and a relatively fast transition to the low voltage when the bit line transitions to the 1 state. Graph (a) illustrates the transition from 1 to strong 0. Both the bit line and the source line transition quickly; it is noted that the source line reaches a voltage close to but below the bit line strong 0 voltage value. Graph (d) illustrates the transition from 1 to weak 0 Both the bit line and source line transition relatively slowly, but in opposite directions.

Figure 5:
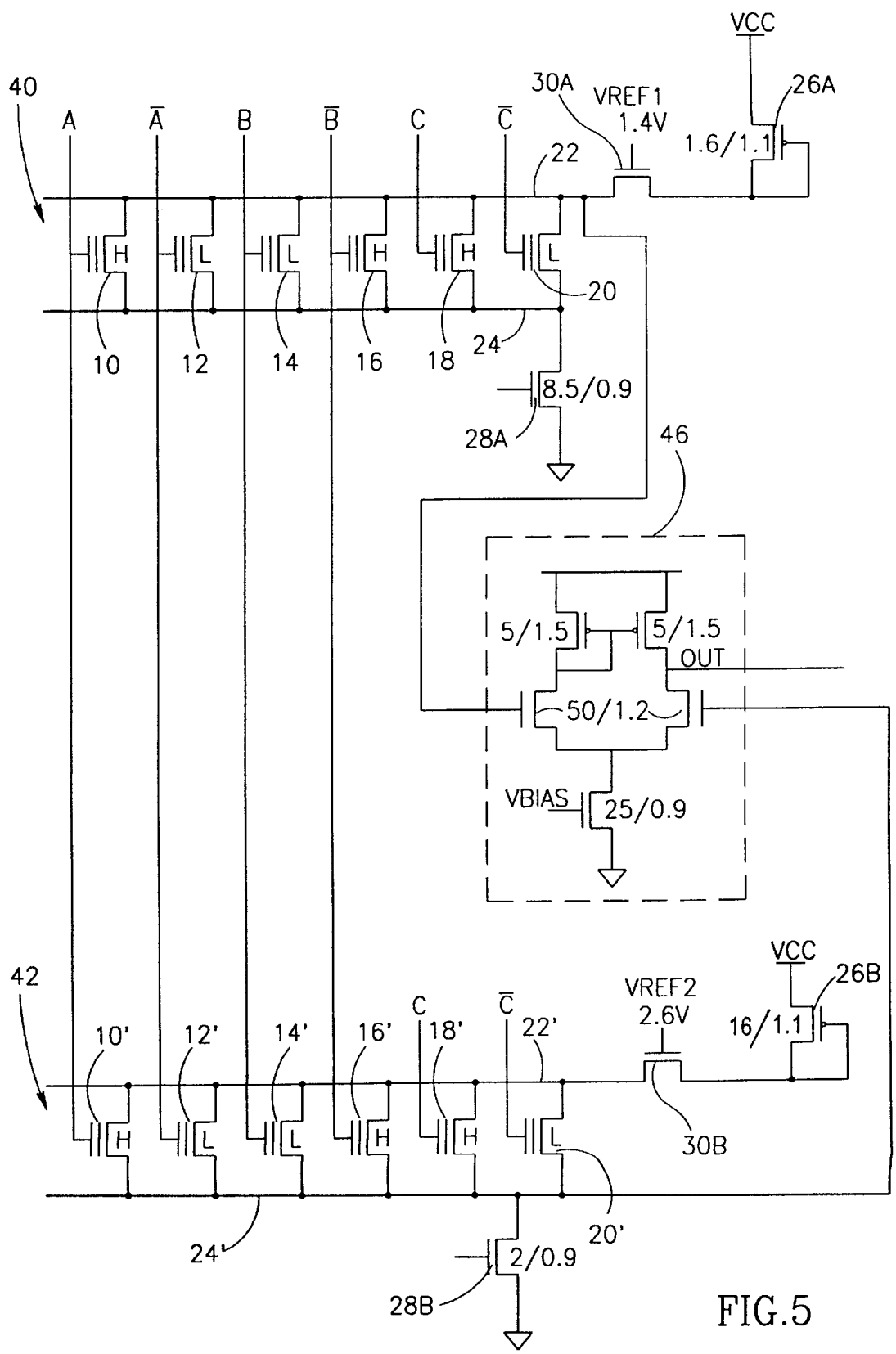
FIG. 5 is a circuit illustration of a first embodiment of a programmable logic device, constructed and operative in accordance with a preferred embodiment of the present invention, utilizing the source line to provide a signal complementary to that of the bit line.
Figure 6:
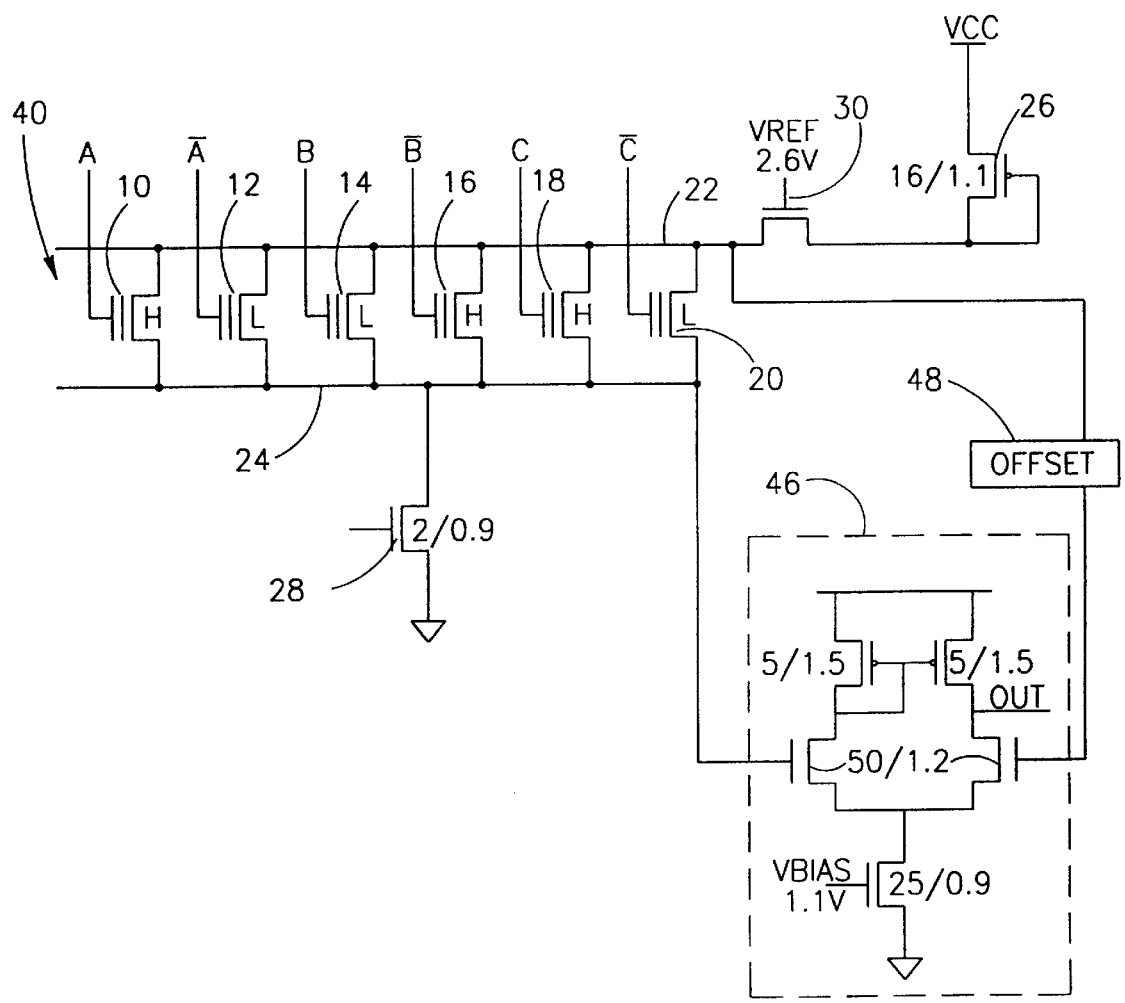
FIG. 6 is a circuit illustration of a second embodiment of a programmable logic device utilizing a first offset circuit.
Figure 8:
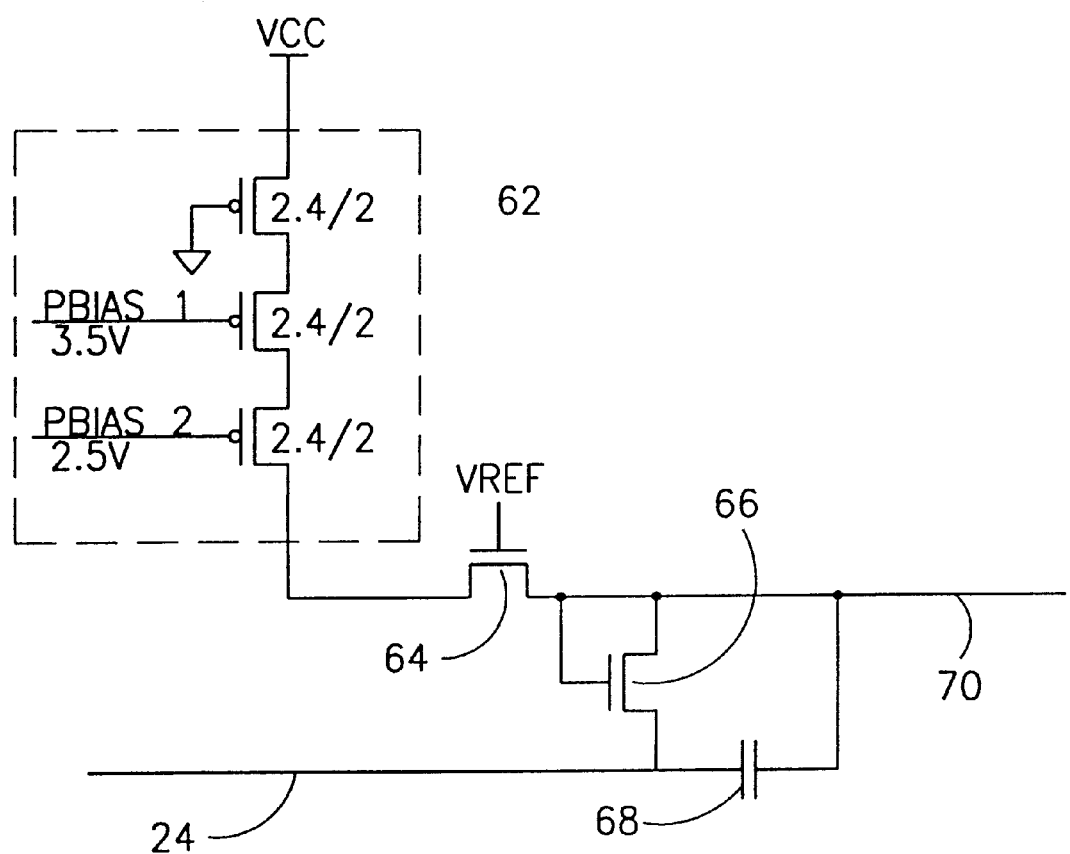
FIG. 8 is a circuit illustration of the second offset circuit of FIG. 7.

The present invention changes the relative voltage levels of the source and bit lines, either by changing their operating points (in the embodiment of FIG. 5) or by offsetting the voltage level of either the bit line or the source line (in the embodiments of FIGS. 6 and 8, respectively). FIG. 4, to which reference is now made, illustrates the transitions when, for example, the source line is raised. In each graph, the source line action is opposite that of the bit line and, typically, the transition of the source line is sharper when the bit line is slow and vice versa. It is also noted that the tripping operation is no longer the voltage of the bit line (i.e. being higher or lower than the trip voltage 32) but the moment when the two voltages cross. As shown in FIG. 4, the cross time, labeled 36, occurs before the trip time, labeled 38, of the prior art. This provides a speed improvement, particularly in the transitions from strong and weak 0 to 1 (graphs (a) and (b)) where the crossing 36 occurs significantly earlier than the tripping 38.

It will be appreciated that, due to the differential sensing, the cross time 36 is relatively robust in the presence of noise. Furthermore, as is known in the art, the gain of a differential sense amplifier is high which ensures that the tripping operation occurs quickly.

Reference is now made to FIG. 5 which illustrates a first embodiment of the present Invention which utilizes the voltage on the source line as a $\overline{BL}$ signal. Similar reference numerals, from FIG. 1, illustrate similar elements in the embodiment of FIG. 6, each row of the array is repeated. One of the rows, labeled 40, provides the bit line signal and the other row, labeled 42, provides the source line signal. Each row has the same number of transistors, programmed the same way. Thus, FIG. 5 denotes the second set of transistors, in row 42, with the same reference numeral but with an additional apostrophe (')

As in the prior art, each row is connected to a pull-up transistor 26 and a pull-down transistor 28. Since the transistors for each row can be of different sizes (and thus, have different strengths), the ones for the bit line row 40 are labeled 26A and 28A and the ones for the source line row are labeled 26B and 28B. Shown also are control transistors 30A and 30B, connected to the two bit lines 22 and 22', which, in accordance with a VREFL or VREF2 signal, respectively, control the voltage levels on the bit lines.

The bit line 22 of row 40 and the source line 24' of the repeated row 42 are connected to the two inputs of a differential sense amplifier 46. Any 20 differential sense amplifier can be utilized; shown in FIG. 5 is one exemplary embodiment. It will be appreciated that the particular structure of the differential sense amplifier is not part of the present invention and therefore, its operation will not be discussed in detail. One exemplary differential sense amplifier can be found in the book *CMOS Analog Circuit Design*, by Phillip E. Allen and Douglas R. Holberg Saunders College Publishing, Harcourt Brace Jovanovich 1987. Chapter 6.2-1, which is incorporated herein by reference, describes a CMOS differential amplifier using N-channel input devices.

In accordance with the preferred embodiment of FIG. 5, the relative strengths of the pull-up and pull-down transistors (26A, 28A) and (28B, 28B), respectively, and the level of the reference voltages VREF1 and VREF2 of each row determine the cross point of the source line and bit line voltages. The cross point is selected to ensure that a transition on the input lines A, $\overline{A}$, B, $\overline{B}$, C, $\overline{C}$, etc. causes the voltage levels of the bit line 22 and the source line 24' to cross, Thus, since the two signals are biased to cross when there is a transition, the differential sense amplifier 46 can sense the crossing of the two signals.

For the example shown in FIG. 5, which is a PLD with EPROM cells, the bit line voltage level is lowered towards that of the source line. Thus, for row 42 providing the source line signal, the bias voltage VREF2 is 2.6V which is the common voltage level for EPROM cells. The pullup 26B is large enough to pull up the bit line 22' and pull-down 28B is small enough to provide little resistance to the source line 24', Pull-up 26B is shown to have width 16 and length 1.1 while pull-down 28B is shown to have width 2 and length 0.9. This is one example, useful for EPROM cells manufactured with 0.8µm technology.

Row 40, which provides the bit line signal, is biased to a much lower voltage level such that the voltage of its bit line 22 will cross the voltage level of the source line 24' of row 42. Thus, the bias voltage VREF1 is set to 1.4V and the pull-down 28A is set to provide a large resistance, thereby to maintain a high resistance thereacross. The high voltage level across pull-down 28A pulls the voltage level of its source line 24 and, accordingly, also of its bit line 22. Thus, the voltage level of bit line 22 is brought low enough to cross that of source line 24'. It is noted that pull-up 26A is set to the same size as that of pull-up 26B.

FIG. 5 also provides widths and lengths of the transistors forming the differential sense amplifier 46 which operates with the voltage levels provided by the bit line 22 and the source line 24'.

It will be appreciated that the source and bit lines can be connected to the differential sense amplifier in one of two ways. In the connection of FIG. 5, the differential sense amplifier 46 provides a high voltage when the bit line 22 has the higher voltage. It, instead, the connections of the source and bit lines are reversed, amplifier 46 produces a high voltage when the source line 24' has the higher voltage. The connections of the source and bit lines can be selected to provide the proper polarity for the circuits connected downstream of the amplifier 46, thereby removing the need for an inverter on the output signal of the differential sense amplifier.

It is noted that the embodiment of FIG. 5 requires a programmable logic device of twice the size in the prior art and the capacitance of the input lines is increased (since they have to charge twice as many gates). Occasionally, such an arrangement is not feasible or the extra capacitance is undesirable. The embodiments of FIGS. 6 and 7, to which reference is now made, function with only a single row and an offset circuit. One embodiment of an off-set circuit is provided in FIG. 8, to which reference is also now made. Elements In FIGS. 6 and 7 similar to those of previous embodiments have similar reference numerals. In the circuit of FIG. 6, the offset circuit operates on the bit line 22 and in the circuit of FIG. 7, the offset circuit operates on the source line 24.

FIG. 6 shows a single row 40 to which are connected, as in the previous embodiment, a pull-down 28, a pullup 26 and a control transistor 30. The bit line 22 is connected, via the control transistor 30 and offset circuitry 48, to one Input of the differential sense amplifier 46. The source line 24 is connected directly to the second input of the differential sense amplifier 46.

Offset circuitry 48 can be any suitable circuitry which lowers the voltage level of the bit line 22 so that the output signal of the offset circuitry 48 crosses the signal of the source line 24 whenever there is a transition on one of the input lines.

Figure 7:
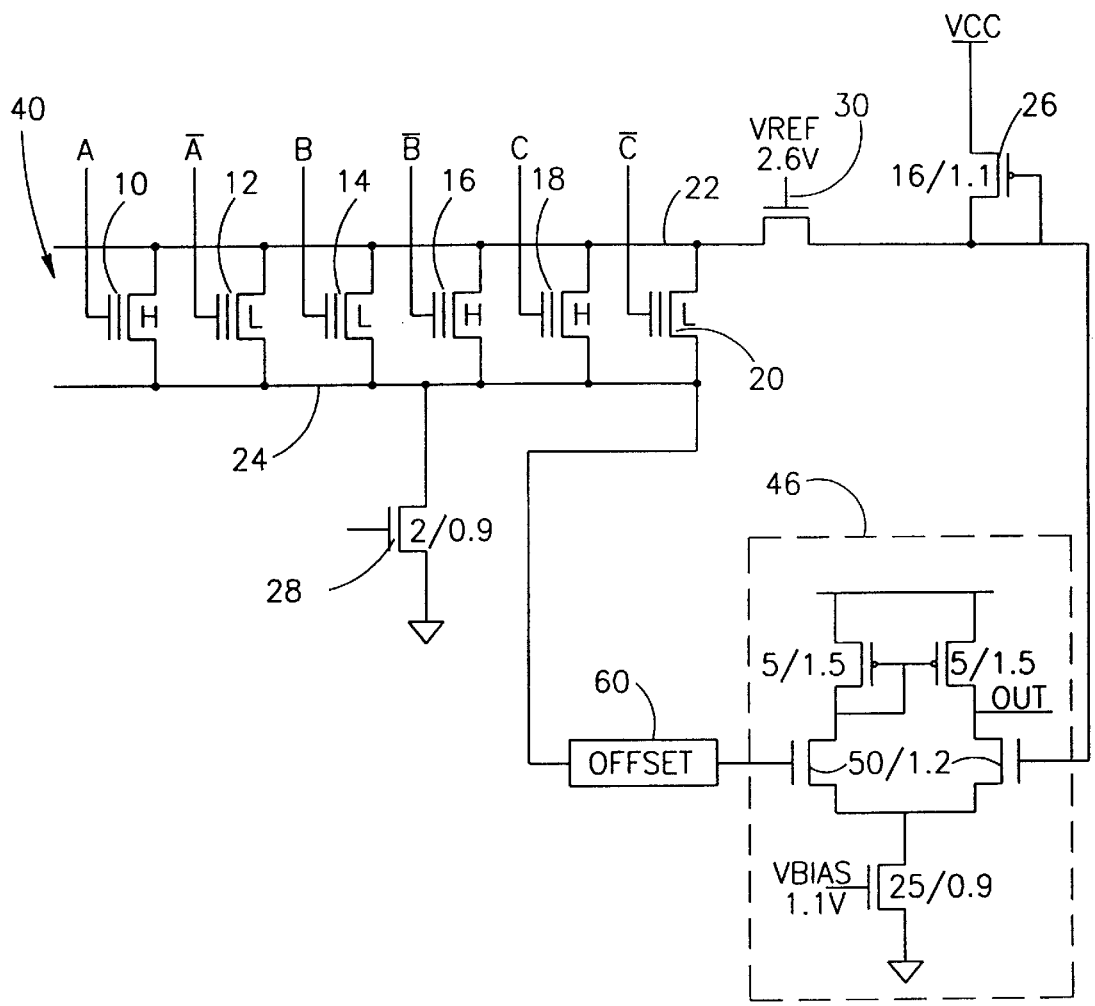
FIG. 7 is a circuit illustration of a second embodiment of a programmable logic device utilizing a second offset circuit.

FIG. 7 shows row 40 connected, as in the previous embodiments, to a pull-down 28, a pull-up 26 and a control transistor 30. In this embodiment, the source line 24 is connected to offset circuitry 50 whose output is connected to the differential sense amplifier 46. The bit line 22 is also connected to the differential sense amplifier 46 but via the control transistor 30.

Offset circuitry 60 can be any suitable circuitry which raises the voltage level of the source line 24 so that the output signal of the offset circuitry 60 crosses the signal of the bit line 22 whenever there is a transition on one of the input lines.

FIG. 8 illustrates one exemplary embodiment of offset circuitry 60 which comprises a weak current source 62, a maximum voltage limiter 64, a diode connected transistor 66 and a capacitor 88. The capacitor 68 is connected in series to the source line 24 and the diode connected transistor 66 is connected between the source line 24 and an output line 70. The weak current source 62 and the maximum voltage limiter 64 are connected in series to the output line 70.

The weak current source 62 comprises three p-channel transistors one of which is fully on and the remaining two of which are partially on. The result is a small flow of current to the maximum voltage limiter 64. Limiter 64 is controlled by the VREF signal, typically at 2.6V, and typically limits the voltage of the output line 70 to slightly below the 2.6V level.

Diode connected transistor 66 functions as a diode and has a voltage drop thereacross. Since transistor 66 is diode connected to the output line 70, the voltage drops from the output line 70 to the source line 24. Thus, transistor 66 provides an output signal whose DC voltage level is higher than that of the source line 24. Capacitor 68 passes any AC transitions from the input bit line 22 to the output line 70. Thus, the voltage level of output line 70 is higher than source line 24 but has the same transitions as source line 24. It is noted that the size of the voltage drop across the diode connected transistor 60 has to be large enough to force the voltage of the output line 70 to cross that of the bit line 22.

It will be appreciate differentially embodiments of FIGS. 6 and 7 provide a differentially sensed transition with a single row of the programmable logic device.

It will be appreciated by persons skilled in the art that the present invention is not limited to what has been particularly shown and described hereinabove. Rather the scope of the present invention is defined only by the claims which follow:

I claim:

1. A programmable logic device including a plurality of logic elements, each element implementing a logical operation on the signals on a multiplicity of input lines, wherein each logic element comprises:
   a. a row of transistors formed between a bit line and a source line, wherein each transistor is connected to a different one of said input lines and has a predefined logic state and the bit line signal on said bit line implements said logical function;
   b. means, having an output complement line, for generating a complement signal to said bit line signal; and
   c. a differential sense amplifier connected to said bit line and said complement line for indicating when said bit line signal has a transition.

2. A programmable logic device according to claim 1 wherein said means for generating comprises:
   a. a second row of transistors formed between a second bit line and a second source line, wherein said second row of transistors has the same predefined logic states and is connected in the same way to said input lines as said first row of transistors and wherein said second source line forms said complement line; and
   b. means for biasing the voltage levels of said first and second rows of transistors so that any transition of the signal on said second source line will cross a corresponding transition of the signal on said first bit line.

3. A programmable logic device according to claim 1 wherein said means for generating comprises offset means for offsetting the signal on said source line so that any transition of the signal produced by said offset means will cross a corresponding transition of said bit line and wherein the output line of said offset means is said complement line.

4. A programmable logic device according to claim 1 wherein said means for generating comprises offset means for offsetting the signal on said bit line so that any transition of the signal produced by said offset means will cross a corresponding transition of said source line and wherein said source line is said complement line.

5. A programmable logic device including a plurality of logic elements, each element implementing a logical operation on the signals on a multiplicity of input lines, wherein each logic element comprises:
   a. a row of transistors formed between a bit line and a source line, wherein each transistor is connected to a different one of said input lines and has a predefined logic state and the bit line signal on said bit line implements said logical function; and
   b. means, having an output complement line, for generating a complement signal to said bit line signal, said means for generating comprising:
      a second row of transistors formed between a second bit line and a second source line, wherein said second row of transistors has the same predefined logic states and is connected in the same way to said input lines as said first row of transistors and wherein said second source line forms said complement line; and
      means for biasing the voltage levels of said first and second rows of transistors so that any transition of the signal on said second source line will cross a corresponding transition of the signal on said first bit line;
   c. said programmable logic device having two output lines, one connected to said bit line and one connected to said output complement line.

6. A programmable logic device including a plurality of logic elements, each element implementing a logical operation on the signals on a multiplicity of input lines, wherein each logic element comprises:
   a. a row of transistors formed between a bit line and a source line, wherein each transistor is connected to a different one of said input lines and has a predefined logic state and the bit line signal on said bit line implements said logical function; and
   b. means for generating comprising offset means for offsetting the signal on said source line so that any transition of the signal produced by said offset means will cross a corresponding transition of said bit line and wherein the output line of said offset means is a complement line to said bit line signal;
   c. said programmable logic device having two output lines, one connected to said bit line and one connected to said output complement line.

7. A programmable logic device including a plurality of logic elements, each element implementing a logical operation on the signals on a multiplicity of input lines, wherein each logic element comprises:
   a. a row of transistors formed between a bit line and a source line, wherein each transistor is connected to a different one of said input lines and has a predefined logic state and the bit line signal on said bit line implements said logical function; and
   b. means for generating comprising offset means for offsetting the signal on said bit line so that any transition of the signal produced by said offset means will cross a corresponding transition of said source line and wherein said source line is a complement line to said bit line signal;
   c. said programmable logic device having two output lines, one connected to said bit line and one connected to said output complement line.

* * * * *